US008836062B2

(12) United States Patent
Franke

(10) Patent No.: US 8,836,062 B2
(45) Date of Patent: Sep. 16, 2014

(54) INTEGRATED PASSIVE COMPONENT

(75) Inventor: Joerg Franke, Freiburg (DE)

(73) Assignee: Micronas GmbH, Freiburg I.Br. (DE)

( * ) Notice: Subject to any disclaimer, the term of this patent is extended or adjusted under 35 U.S.C. 154(b) by 184 days.

(21) Appl. No.: 13/440,567

(22) Filed: Apr. 5, 2012

(65) Prior Publication Data
US 2012/0256283 A1 Oct. 11, 2012

(30) Foreign Application Priority Data
Apr. 5, 2011 (DE) .......................... 10 2011 016 159

(51) Int. Cl.
H01L 27/22 (2006.01)
H01F 5/00 (2006.01)
H01L 23/522 (2006.01)
H01F 27/02 (2006.01)

(52) U.S. Cl.
CPC .............. *H01F 5/00* (2013.01); *H01L 23/5227* (2013.01); *H01F 27/027* (2013.01)
USPC .......................................................... 257/427

(58) Field of Classification Search
USPC .......................................... 257/427, E27.005
See application file for complete search history.

(56) References Cited

U.S. PATENT DOCUMENTS

| 6,410,974 | B2 | 6/2002 | Chu et al. |
| 6,480,086 | B1 | 11/2002 | Kluge et al. |
| 6,507,189 | B2 * | 1/2003 | Woolsey et al. ......... 324/207.26 |
| 7,053,165 | B2 * | 5/2006 | Furumiya et al. ............. 257/531 |
| 7,834,464 | B2 | 11/2010 | Meyer et al. |
| 2006/0262593 | A1 * | 11/2006 | Aouba et al. ................... 365/158 |
| 2009/0057822 | A1 * | 3/2009 | Wen et al. ...................... 257/531 |
| 2009/0167301 | A1 * | 7/2009 | Ausserlechner .............. 324/252 |
| 2011/0095395 | A1 * | 4/2011 | Ellul et al. ..................... 257/531 |

FOREIGN PATENT DOCUMENTS

| DE | 600 32 336 T2 | 6/2007 |
| DE | 699 37 868 T2 | 1/2009 |
| DE | 10 2008 050 972 A1 | 4/2009 |

OTHER PUBLICATIONS

Badilita et al., "3D High Aspect Ratio, Mems Integrated Micro-Solenoids and Helmholtz Micro-Coils", Transducers 2009, Denver, CO, USA, Jun. 21-25, 2009, 1106-1109.
Kratt et al., "High aspect ratio PMMA posts and characterization method for micro coils manufactured with an automatic wire bonder", Sensors and Actuators A 156 (2009) 328-333, Elsevier Journal, pp. 328-333.

* cited by examiner

*Primary Examiner* — Fernando L Toledo
*Assistant Examiner* — Neil Prasad
(74) *Attorney, Agent, or Firm* — Muncy, Geissler, Olds & Lowe, P.C.

(57) ABSTRACT

An integrated passive component having a semiconductor body, arranged on a metal substrate and having a first surface, and a plurality of metal surfaces formed on the surface, and an integrated circuit formed on the surface of the semiconductor body, whereby the integrated circuit is connected by traces to the metal surfaces, and having a dielectric passivation layer formed on the surface, and the metal surfaces are connected to pins by bonding wires, and a first coil former, formed above the dielectric layer, with a winding, whereby the winding has a first connector and a second connector, and whereby the winding is formed as a wire or litz wire and the first connector of the winding is connected to a first metal surface and the second connector to a second metal surface.

20 Claims, 3 Drawing Sheets

INTEGRATED PASSIVE COMPONENT

This nonprovisional application claims priority under 35 U.S.C. §119(a) to German Patent Application No. DE 10 2011 016 159.7, which was filed in Germany on Apr. 5, 2011, and which is herein incorporated by reference.

BACKGROUND OF THE INVENTION

1. Field of the Invention

The invention relates to an integrated passive component.

2. Description of the Background Art

DE 600 32 336 T2, DE 699 37 868 T2 (which corresponds to U.S. Pat. No. 6,410,974), and DE 10 2008 050 972 A1 (which corresponds to U.S. Pat. No. 7,834,464) disclose different approaches for integrating a coil on or with or in a semiconductor body. Thus, for example, the formation of a spiral inductor in the different trace layers below the passivation of the semiconductor body is known from the disclosure in DE 600 32 336 T2.

SUMMARY OF THE INVENTION

It is therefore an object of the invention to provide a device that refines the conventional art. The object is attained in an embodiment by an integrated passive component.

According to an embodiment, an integrated passive component is provided having a semiconductor body, arranged on a metal substrate and having a first surface, and a plurality of metal surfaces formed on the surface, and an integrated circuit formed on the surface of the semiconductor body, whereby the integrated circuit is connected via traces to the metal surfaces, and having a dielectric passivation layer formed on the surface, and the metal surfaces are connected to pins via bonding wires, and a first coil former, formed above the dielectric layer, with a winding, whereby the winding has a first connector and a second connector, and whereby the winding is formed as a wire or litz wire and the first connector of the winding is connected to a first metal surface and the second connector to a second metal surface.

An advantage of the integrated passive component according to an embodiment of the invention is that a component formed as a coil, i.e., a coil former having at least one winding, can be integrated into a standard semiconductor fabrication process. Tests by the applicant have shown that according to the device of the invention, coils with a high quality factor, preferably a quality factor above 5, most preferably with a quality factor above 10, can be integrated cost-effectively and reliably.

In this case, the coil former is produced preferably at the end of the semiconductor fabrication process by means of a lithography process. It is preferred to produce coil formers at the wafer level and then to dice the wafer, which include a plurality of semiconductor bodies, which can also be called dies. The dies or the individual semiconductor bodies can be arranged on a metal substrate, also called a lead frame. In a subsequent bonding process, a single winding or a plurality of windings around the coil former are produced preferably by means of a bonding wire, whereby the ends, i.e., the first end and/or the second end of the winding, are each attached to metal surfaces. The metal surfaces are formed on the surface of the semiconductor body and called pads. Furthermore, the additional metal surfaces are connected to the pins by means of the bonding process.

In an embodiment, the coil former can have a substantially cylindrical form, whereby the form is formed on the surface of the semiconductor body along the normal vector. As a result, at least one or also a plurality of coil formers can be produced on the individual semiconductor bodies by means of a standard exposure process during the wafer fabrication. Furthermore, it is preferred to make the first coil former from a photo lacquer, such as SU8 lacquer. Preferably, the first coil former has a height of less than 700 µm and/or a diameter of less than 400 µm. Tests by the applicant have shown that the coil former can also be formed as a depression in a lacquer layer on the semiconductor surface. In this case, the trench width is to be dimensioned in such a way that a wire can be wound around the coil former. It is preferred further to form the coil former directly on the surface of the passivation layer.

According to an embodiment, the coil can be connected to the integrated circuit by means of the metal surfaces, i.e., by means of the first metal surface and/or the second metal surface. According to an alternative embodiment, the metal surfaces that are connected to the ends of the coil are preferably connected to other metal surfaces by means of traces. It is preferred that the additional metal surfaces are connected to pins by means of bonding wires. As a result, the coil can be supplied with external signals as well.

According to another embodiment, a magnetic field sensor, for example, a Hall sensor, is arranged below the first coil former. In this way, inter alia, the strength of the coil field can be measured very accurately and reliably. In an advantageous embodiment, the coil former, which is preferably made as a cylinder wall and accordingly has a depression in the interior, can be filled with a ferromagnetic material. Particularly with an embodiment in which a second coil former with a second winding is provided, whereby the first coil former accommodates the second coil former at least partially, a transformer coupling between the two coils can be improved thereby.

As the fabrication of the coil former can be integrated into the fabrication process, it is preferred to arrange both the semiconductor body and the first and/or the second coil former in a single housing. In this regard, the housing, which preferably is formed of plastic, is produced in a so-called molding process. For example, a QFN housing with an integrated coil can be formed.

In an embodiment, a third coil former, spaced apart from the first coil former with the first winding, with a third winding is formed above the dielectric passivation layer. It is possible to connect the third coil former to the first coil former both in series and parallel.

According to another embodiment, a flux concentrator can be arranged between the metal substrate and the semiconductor body. To improve the magnetic coupling between the first coil and the third coil, the flux concentrator is formed both below the first coil former and below the third coil former. It is understood that the flux coupling device has a ferromagnetic material, which has a permeability as high as possible and a low remanence. Tests by the applicant have shown that the flux coupling device can be made preferably plate-shaped as a soft magnetic layer. Both small iron plates and Mu-metal compositions can be used for this purpose. Further, to suppress eddy current losses, the plate-like flux coupling device can be made as a layered plate system, i.e., made of a plurality of metal layers. It is preferred, furthermore, to arrange at least one magnetic field sensor each under the two coils.

In an embodiment, the integrated passive component can be used for magnetic field-free position measurement. In this regard, the change in inductance in the coil, because of the approach of the component to a magnetic material, can be determined as a measure of the distance. Because the measured change in inductance is compared with values from a predefined value field, in a known arrangement the distance of the component to the magnetic material can be determined.

In another embodiment, the integrated component can be used for measuring magnetic fields. In this regard, a magnetic field sensor is arranged below the first coil former of the first coil and/or in the case of a plurality of coils under a plurality of coil formers. Preferably, there is a magnetic flux concentrator in the form of a soft magnetic material in the coil former.

In another embodiment, the passive component can be used for the calibration and testing of magnetic field sensors. To this end, a current is applied to the coil above the magnetic field sensor. In this regard, both the current can be adjusted in such a way that an outer magnetic field can be shielded and the magnetic field sensor becomes magnetic field-free and a magnetic field with a defined strength can be generated.

In an embodiment, the component can be used for transmitting data from a coil to a magnetic field sensor. In this case, data can be transmitted in the form of an optocoupler in a likewise galvanically decoupled manner by means of a preferably changing magnetic field.

In another embodiment, the dynamic measuring range can be increased by means of the combination of coil and magnetic field sensor. In comparison to the magnetic fields designed thus far only for magnetic field sensors and accordingly changing slowly over time, now in addition rapidly changing magnetic fields can be determined as well.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
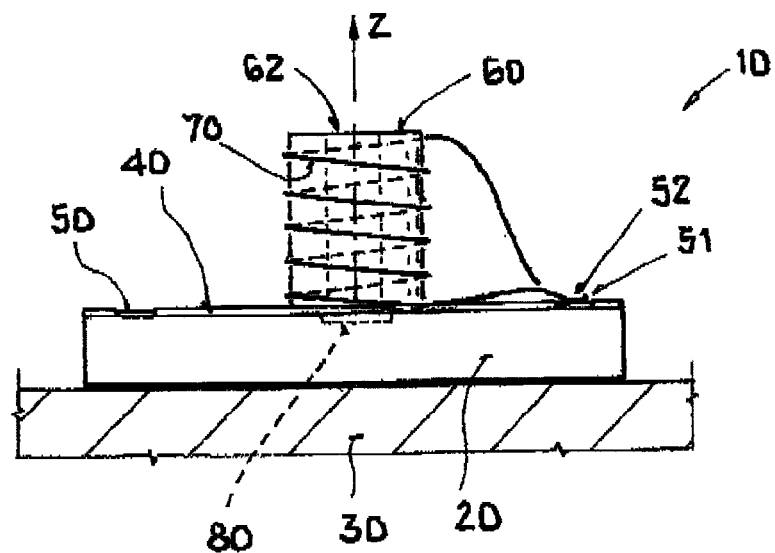
FIG. 1 shows a schematic cross-sectional view of a first embodiment.

The illustration in FIG. 1 shows an embodiment of an integrated passive component 10, having a semiconductor body 20 on a metal substrate 30. Semiconductor body 20 has on its surface a passivation layer 40 with openings. Passivation layer 40 can include a nitride layer. Metal surfaces 50 are formed in the openings of the passivation layer, which are produced by a so-called pad window etching process. Preferably, metal surfaces 50 are arranged near the edge of semiconductor body 20. A coil, having a cylindrical first coil former 60 with an opening 62 in the center and a wire winding 70, which has a plurality of turns, is arranged on the surface of passivation layer 40. The first end of wire winding 70 is connected to a first metal surface 51 and the second end of the wire winding to a second metal surface 52 (not visible). Coil former 60 is substantially perpendicular to the surface of semiconductor body 20; i.e., the longitudinal axis is virtually parallel to the normal vector z. A magnetic sensor 80 is arranged on the surface of the semiconductor body below first coil former 60. The strength of the magnetic field of the coil can be determined very precisely by magnetic field sensor 80, which is formed preferably as a Hall sensor. The current strength in the coil can be determined from the strength of the magnetic field.

Figure 2:
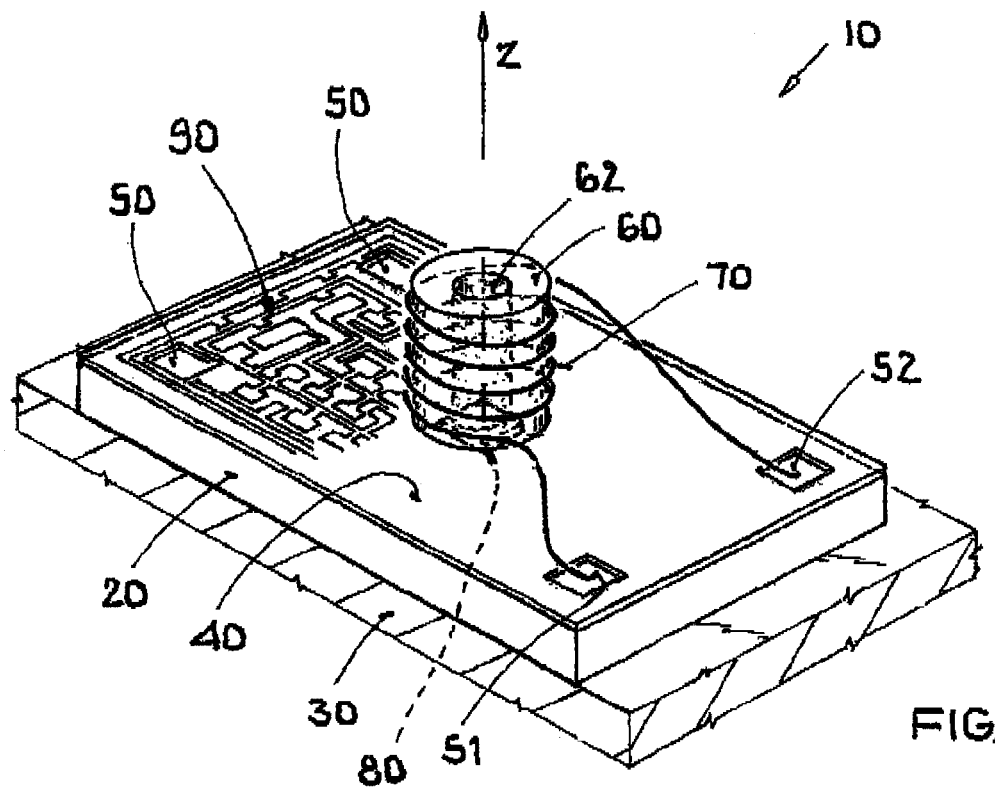
FIG. 2 shows a perspective view of the embodiment of FIG. 1.

A plan view of the embodiment of FIG. 1 is shown in FIG. 2. Only the differences will be described below. The one trace level 90 with which the components of an integrated circuit (not shown) are connected to one another and to metal surfaces 50 is below passivation layer 40.

Figure 3:
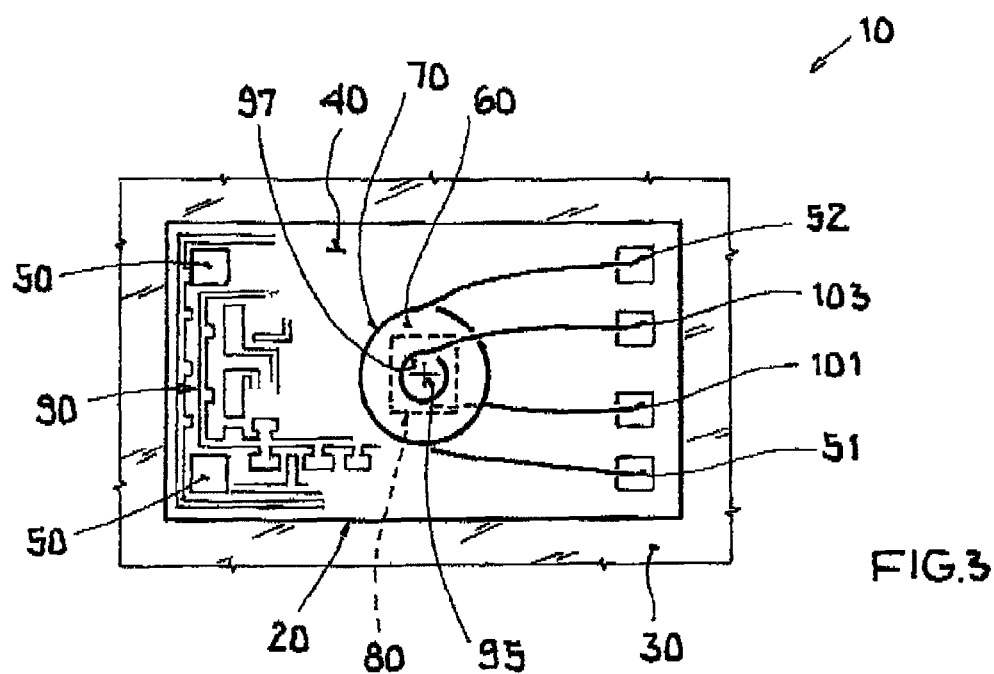
FIG. 3 shows a schematic plan view of an embodiment with two nested coils.

Another embodiment is shown in a plan view in FIG. 3. Only the differences in regard to the embodiment in FIG. 2 will be explained below. The first coil former 60 comprises a second internal coil former 95 with another wire winding 97, whereby both ends of wire winding 97 are connected to a third metal surface 101 and a fourth metal surface 103.

Figure 4:
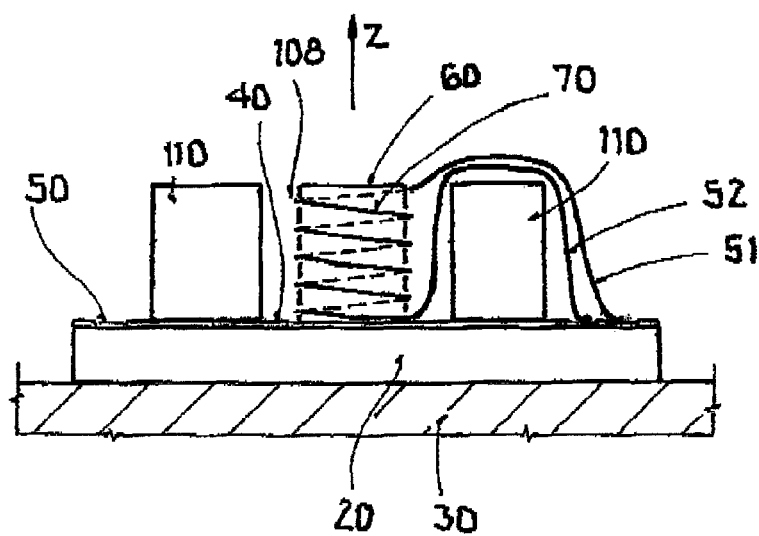
FIG. 4 shows a schematic cross section of an embodiment with a depression in a layer.

Another embodiment is shown in a sectional view in FIG. 4. In this case, coil former 60 is formed as a trench-shaped opening 108 in layer 110. Layer 110 is preferably formed as a lacquer layer. An SU8 lacquer can be used especially for this purpose. Wire winding 70 is formed around coil former 60. The two wire ends of wire winding 70 are guided above layer 110 and then along a side surface of layer 110 to the appropriate metal surface 51 and 52.

Figure 5:
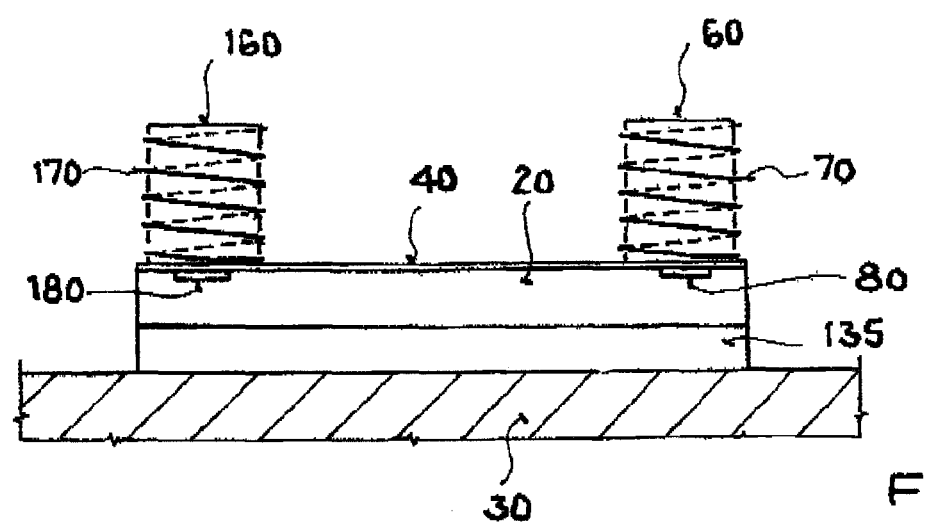
FIG. 5 shows a schematic cross section of an embodiment with a flux coupling device.

Another embodiment is shown in the illustration in FIG. 5. In addition to the first coil with the first coil former 60, a third coil with a third coil former 160 with a third wire winding 170 is formed on the surface of passivation layer 40. A second magnetic field sensor 180 is formed below third coil former 160. A flux coupling device 135 is arranged between semiconductor body 20 and metal substrate 30. Flux coupling device 135 couples a magnetic field of the first coil to the third coil and vice versa. Flux coupling device 135 is formed as a soft magnetic layer or plate, whereby the two ends of the plate completely cover the bottom sides of the first coil and the third coil. Preferably, flux coupling device 135 has a ferromagnetic material, which has a permeability as high as possible and a low remanence.

It is noted that coil former 60, 95 preferably has a plastic in all embodiments. In particular, lacquers with a sufficient stability, such as, for example, an SU8 lacquer, can be used in particular for the formation of coil former 60, 95.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An integrated passive component comprising:
a semiconductor body arranged on a metal substrate and having a first surface, and a plurality of metal surfaces formed on the first surface, the metal surfaces being connectable to pins via bonding wires;
an integrated circuit formed on the first surface of the semiconductor body, the integrated circuit being connectable via traces to the metal surfaces;
a dielectric passivation layer formed on the first surface;
a first coil former having a winding, the first coil former being arranged above the dielectric passivation layer, the winding having a first connector and a second connector, the winding being configured as a wire or strand and the first connector of the winding being connectable to a first metal surface and the second connector being connectable to a second metal surface, the first metal surface being connectable with the integrated circuit; and a magnetic field sensor arranged below the first coil former.

2. The integrated passive component according to claim 1, wherein the coil former has a substantially cylindrical form, and wherein the coil former is formed on the first surface of the semiconductor body along a normal vector.

3. The integrated passive component according to claim 1, wherein the second metal surface is connectable to the integrated circuit.

4. The integrated passive component according to claim 1, wherein the magnetic field sensor is a Hall sensor.

5. The integrated passive component according to claim 1, wherein the first coil former has an SU8 lacquer.

6. The integrated passive component according to claim 1, wherein the first coil former has a height of less than 700 µm.

7. The integrated passive component according to claim 1, wherein the first coil former has a diameter of less than 400 µm.

8. The integrated passive component according to claim 1, wherein the coil former is formed as a depression in a lacquer layer on the semiconductor surface.

9. The integrated passive component according to claim 1, wherein a second coil former with a second winding is provided and the first coil former accommodates the second coil former at least partially.

10. The integrated passive component according to claim 1, wherein the first coil former is partially filled with a ferromagnetic material.

11. The integrated passive component according to claim 1, wherein the coil former is formed directly on the surface of the passivation layer.

12. The integrated passive component according to claim 9, wherein the semiconductor body and the first coil former and/or the second coil former are arranged in a single housing.

13. The integrated passive component according to claim 12, wherein the housing is formed of plastic.

14. The integrated passive component according to claim 9, wherein a third coil former, spaced apart from the first coil former, with a third winding is formed above the dielectric passivation layer.

15. The integrated passive component according to claim 1, wherein a flux concentrator is arranged between the metal substrate and the semiconductor body.

16. The integrated passive component according to claim 15, wherein the flux concentrator is formed below the first coil former and below the third coil former.

17. The integrated passive component according to claim 1, wherein the integrated passive component is a component for magnetic field-free position measurement.

18. The integrated passive component according to claim 1, wherein the integrated passive component is a component for measuring magnetic fields.

19. The integrated passive component according to claim 1, wherein the integrated passive component is a component calibration and testing of magnetic field sensors.

20. The integrated passive component according to claim 1, wherein the integrated passive component is a component for transmitting data to a magnetic field sensor.

* * * * *